(12) United States Patent
Kim et al.

(10) Patent No.: US 7,919,919 B2
(45) Date of Patent: Apr. 5, 2011

(54) ORGANIC ELECTROLUMINESCENT DISPLAY HAVING A SPECIFIC STRUCTURE FOR A PAD SUPPLYING THE DRIVE SIGNAL

(75) Inventors: Ki Hong Kim, Daegu (KR); Hyo Dae Bae, Daegu (KR); Jae Cheol Kwon, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 263 days.

(21) Appl. No.: 11/826,762

(22) Filed: Jul. 18, 2007

(65) Prior Publication Data

US 2007/0262711 A1    Nov. 15, 2007

Related U.S. Application Data

(62) Division of application No. 11/058,607, filed on Feb. 16, 2005, now Pat. No. 7,358,664.

(30) Foreign Application Priority Data

Feb. 20, 2004  (KR) .............................. 10-2004-11583
Sep. 17, 2004  (KR) .............................. 10-2004-74579

(51) Int. Cl.
*H05B 33/00* (2006.01)
*H01L 21/00* (2006.01)
*H01L 29/04* (2006.01)

(52) U.S. Cl. .......... 313/506; 313/507; 313/512; 257/72; 257/59; 257/347

(58) Field of Classification Search ........... 313/501–512
See application file for complete search history.

(56) References Cited

U.S. PATENT DOCUMENTS

| 6,624,571 B1 | 9/2003 | Toyoyasu et al. |
| 6,624,572 B1* | 9/2003 | Kim et al. ................ 313/512 |
| 2001/0054868 A1 | 12/2001 | Okuyama et al. |
| 2002/0044250 A1* | 4/2002 | Yoo et al. ................ 349/149 |
| 2002/0130324 A1* | 9/2002 | Song et al. ................ 257/72 |
| 2003/0094895 A1 | 5/2003 | Okuyama et al. |
| 2003/0122140 A1* | 7/2003 | Yamazaki et al. ........... 257/88 |
| 2003/0183830 A1* | 10/2003 | Yamazaki et al. ........... 257/90 |

(Continued)

FOREIGN PATENT DOCUMENTS

GB     2 331 183 A    5/1999

(Continued)

OTHER PUBLICATIONS

Tadokoro, Toyoasu, Japanese Patent Publication 2003-217835, Jul. 2003, machine translation.*

*Primary Examiner* — Nimeshkumar D Patel
*Assistant Examiner* — Tracie Green
(74) *Attorney, Agent, or Firm* — Birch, Stewart, Kolasch & Birch, LLP

(57) ABSTRACT

An organic electro-luminescence display device and a fabricating method thereof for preventing a badness of a pad portion are disclosed. In the organic electro-luminescence display device, a first conductive layer is electrically connected to any at least one of first and second electrodes of the organic electro-luminescence array. A second conductive layer is provided on the first conductive layer. A dummy insulating pattern is provided to cover the first and second conductive layer and has a hole for exposing a portion of the second conductive layer.

8 Claims, 10 Drawing Sheets

U.S. PATENT DOCUMENTS

| | | |
|---|---|---|
| 2004/0211966 A1 * | 10/2004 | Guenther et al. ............... 257/79 |
| 2004/0245920 A1 | 12/2004 | Nakamura |
| 2005/0057146 A1 * | 3/2005 | Lee et al. ...................... 313/504 |

FOREIGN PATENT DOCUMENTS

| | | |
|---|---|---|
| JP | 02-135694 A | 5/1990 |
| JP | 2000-21564 A | 1/2000 |
| JP | 2000-21566 A | 1/2000 |
| JP | 2000-21567 A | 1/2000 |
| JP | 2000-347636 A | 12/2000 |
| JP | 2000-357585 A | 12/2000 |
| JP | 2001-351778 A | 12/2001 |
| JP | 2002-33188 A | 1/2002 |
| JP | 2002-203673 A | 7/2002 |
| JP | 2003-100450 A | 4/2003 |
| JP | 2003-217835 A | 7/2003 |
| JP | 2003-272834 A | 9/2003 |
| JP | 2005-183209 A | 7/2005 |
| WO | WO-03/005773 A1 | 1/2003 |
| WO | WO 03/086022 A1 | 10/2003 |

* cited by examiner

ORGANIC ELECTROLUMINESCENT DISPLAY HAVING A SPECIFIC STRUCTURE FOR A PAD SUPPLYING THE DRIVE SIGNAL

CROSS-REFERENCE TO RELATED APPLICATION

This application is a Divisional of application Ser. No. 11/058,607 filed on Feb. 16, 2005 now U.S. Pat. No. 7,358, 664, and for which priority is claimed under 35 U.S.C. §120; and this application claims priority of Application Nos. P2004-11583 and P2004-74579 filed in Korea on Feb. 20, 2004 and Sep. 17, 2004, which are hereby incorporated by reference.

BACKGROUND OF THE INVENTION

1. Field of the Invention

This invention relates to an electro-luminescence display (ELD), and more particularly to an organic electro-luminescence display device and a fabricating method thereof that are adaptive for preventing a badness of a pad portion.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence (EL) display, etc. Also, there have been actively processed studies for attempting to make a high display quality and a large-dimension screen of the flat panel display device.

In such flat panel display devices, the PDP has drawbacks in that it has been highlighted as the most advantageous display device to make a light weight, a small size and a large dimension screen because its structure and manufacturing process are simple, but it has low light-emission efficiency and large power consumption. On the other hand, the active matrix LCD employing a thin film transistor (TFT) as a switching device has drawbacks in that it is difficult to make a large dimension screen because a semiconductor process is used, and in that it has large power consumption due to a backlight unit and has a large light loss and a narrow viewing angle due to optical devices such as a polarizing filter, a prism sheet, a diffuser and the like.

Meanwhile, the EL display device is largely classified into an inorganic EL display device and an organic EL display device depending upon a material of a light-emitting layer, and is a self-luminous device. When compared with the above-mentioned display devices, the EL display device has advantages of a fast response speed, large light-emission efficiency, a large brightness and a large viewing angle. The inorganic EL display device has a larger power consumption than the organic EL display device, and can not obtain a higher brightness than the organic EL display device and can not emit various colors such as red(R), green(G) and blue(B) colors. On the other hand, the organic EL display device is driven with a low direct current voltage of tens of volts, and has a fast response speed. Also, the organic EL display device can obtain a high brightness, and can emit various colors of red(R), green(G) and blue(B). Thus, the organic EL display device is suitable for a post-generation flat panel display device.

FIG. 1 is a schematic section view showing a structure of a conventional organic EL display device, and FIG. 2 is a section view of the organic EL array taken along the I-I' line in FIG. 1.

Referring to FIG. 1 and FIG. 2, the organic EL array 50 has a first electrode (or anode electrode) 4 and a second electrode (or cathode electrode) 12 provided on a substrate 2 in a direction crossing each other.

A plurality of first electrodes 4 are formed on the substrate 2 in such a manner to be spaced at a desired distance from each other. An insulating film 6 having an aperture for each EL cell area is formed on the substrate 2 provided with the first electrode 4. On the insulating film 6, a barrier rib 8 for making a separation of an organic light-emitting layer 10 and the second electrode 12 to be formed thereon is positioned. The barrier rib 8 is provided in a direction crossing the first electrode 4, and has an overhang structure in which the upper portion thereof has a larger width than the lower portion thereof. The organic light-emitting layer made from an organic compound and the second electrode 12 are entirely deposited onto the insulating film 6 provided with the barrier rib 8. The organic light-emitting layer 10 expresses red(R), green(G) and blue(B) colors. Generally, the organic light-emitting layer 10 is formed by patterning individual organic materials light-emitting red, green and blue colors for each pixel P.

As shown in FIG. 2, the organic light-emitting layer 10 includes a hole injection layer 10e, a hole carrier layer 10d, a light-emitting layer 10c, an electron carrier layer 10b and an electron injection layer 10a that are sequentially provided on the first electrode 4.

In such an organic EL display device, if a voltage is applied between the first electrode 4 and the second electrode 12, then electrons (or cathodes) generated from the second electrode 12 are moved, via the electron injection layer 10a and the electron carrier layer 10b, into the light-emitting layer 10c. Further, holes (or anodes) generated from the first electrode 4 are moved, via the hole injection layer 10e and the hole carrier layer 10d, into the light-emitting layer 10c. Thus, the light-emitting layer 10c forms exiton by a re-combination of electrons and holes fed from the electron carrier layer 10b and the hole carrier layer 10d. Then, the exiton is again excited into a base state to emit a certain energy of light, via the first electrode 4, into the exterior, thereby displaying a picture.

The organic EL array 50 has a property liable to be deteriorated by moisture and oxygen. In order to overcome this problem, an encapsulation process is carried out. Thus, the substrate 2 provided with the organic EL array 50 is joined to a cap 28 by a sealant 26.

FIG. 3 shows a pad portion of the conventional organic EL display device.

A pad 37 of the pad portion of the organic EL display device shown in FIG. 3 is electrically connected to a signal supplying film 32 such as a chip on film (COF) and a tape carrier package (TCP), etc. with having an anisotropic conductive film 30 therebetween for the purpose of receiving a driving signal from the exterior thereof. The pad 37 has a structure in which a transparent conductive layer 36 connected to the first electrode 4 or the second electrode 12 of the organic EL array 50 and opaque conductive layer 34 are layer-built. Herein, indium-tin-oxide (ITO), indium-zinc-oxide (IZO), indium-tin-zinc-oxide (ITZO) or the like is used as the transparent conductive layer 36 while molybdenum (Mo), etc. is used as the opaque conductive layer 34. Further, a silicon film 38 for preventing an oxidation of the opaque conductive layer 34 caused by moisture and oxygen, etc. is provided on the opaque conductive layer 34.

Meanwhile, the opaque conductive film 34 provided at the pad portion of the conventional organic EL display device is corroded due to moisture ($H_2O$) and oxygen ($O_2$), etc., thereby frequently causing a poor pad problem in that a driving is not applied via the signal supplying film 32.

This will be described in detail below.

Generally, the opaque conductive layer 34 made from molybdenum (Mo), etc. has a property of oxidation or corrosion when it is exposed to moisture and oxygen, etc. Such an opaque conductive layer 34 is exposed to moisture or oxygen in the atmosphere as shown in FIG. 4 in the course of carrying out a joint process of the substrate 2 provided with the organic EL array 50 to the cap 28 and a connection process of the pad 37 to the signal supplying film 32 with having the ACF 30 therebetween, etc. The exposed opaque conductive layer 34 undergoes oxidation. Also, after forming the silicon film 38, oxygen and moisture are permeated into an interface among the silicon film 38, the transparent conductive layer 36 and the opaque conductive layer 34, thereby causing an oxidation of the opaque conductive layer 34. Such an oxidation accelerates an galvanic corrosion resulted from a difference of voltages applied to each pad 37, thereby causing a poor pad portion problem in that an external driving signal is not applied to the organic EL array 50.

SUMMARY OF THE INVENTION

Accordingly, it is an object of the present invention to provide an organic electro-luminescence display device and a fabricating method thereof that are adaptive for preventing a badness of a pad portion.

In order to achieve these and other objects of the invention, a pad portion of an organic electro-luminescence display device according to one aspect of the present invention includes a first conductive layer electrically connected to any at least one of first and second electrodes of the organic electro-luminescence array; a second conductive layer provided on the first conductive layer; and a dummy insulating pattern provided to cover the first and second conductive layer and having a hole for exposing a portion of the second conductive layer.

The organic electro-luminescence display device further includes a cap for packaging the organic electro-luminescence array; and a signal supplying film electrically connected, via said hole for exposing the second conductive layer, to the pad.

The organic electro-luminescence display device further includes a silicon film provided at an interface area between the dummy insulating pattern and the substrate.

In the organic electro-luminescence display device, the organic electro-luminescence array includes an insulating film for partially exposing the first electrode to define a light-emitting area, and said insulating film is formed from the same material as the dummy insulating pattern.

In a method of fabricating an organic electro-luminescence display device, having a process of forming a pad portion for transferring a driving signal to an organic electro-luminescence array, according to another aspect of the present invention, the process of forming said pad portion includes the steps of forming a first conductive layer electrically connected to any at least one of first and second electrodes of the organic electro-luminescence array on a substrate; forming a second conductive layer on the first conductive layer; and forming a dummy insulating pattern provided to cover the first and second conductive layer and having a hole for exposing a portion of the second conductive layer.

The method further includes the steps of joining a cap with the substrate to make a packaging of the organic electro-luminescence array; and connecting a signal supplying film, via said hole for exposing the second conductive layer, to the pad.

The method further includes the step of forming a silicon film at an interface area between the dummy insulating pattern and the substrate.

In the method, the organic electro-luminescence array includes an insulating film for partially exposing the first electrode to define a light-emitting area, and said insulating film is simultaneously formed from the same material as the dummy insulating pattern.

An organic electro-luminescence display device according to still another aspect of the present invention includes an organic electro-luminescence array; and a pad for applying a driving signal to the organic electro-luminescence array and having a structure in which a first conductive layer and a second conductive layer exposing a portion of the first conductive layer are built.

The organic electro-luminescence display device further includes a packaging plate for enclosing the organic electro-luminescence array; a signal supplying film electrically connected to the pad; and a silicon layer provided on the first conductive layer.

In the organic electro-luminescence display device, the second conductive layer is partially removed from an area other than the packaging plate and the signal supplying film.

In the organic electro-luminescence display device, the first conductive layer contains an oxide, and the second conductive layer contains molybdenum (Mo).

In the organic electro-luminescence display device, the organic electro-luminescence array has an anode electrode and a cathode electrode, and the first conductive layer is formed from the same material as any at least one of the anode electrode and the cathode electrode.

A method of fabricating an organic electro-luminescence display device according to still another aspect of the present invention includes the steps of forming an organic electro-luminescence array; and forming a pad having a structure in which a first conductive layer extended from the organic electro-luminescence array and a second conductive layer exposing a portion of the first conductive layer are built.

The method further includes the steps of joining a packaging plate with the substrate in such a manner to enclose the organic electro-luminescence array; connecting a signal supplying film to the pad for the purpose of applying an external driving signal to the organic electro-luminescence array; and forming a silicon layer on the first conductive layer.

In the method, the second conductive layer is partially removed from an area other than the packaging plate and the signal supplying film.

In the method, the first conductive layer contains an oxide, and the second conductive layer contains molybdenum (Mo).

In the method, the organic electro-luminescence array has an anode electrode and a cathode electrode, and the first conductive layer is formed from the same material as any at least one of the anode electrode and the cathode electrode.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 5 to 10.

Figure 5:
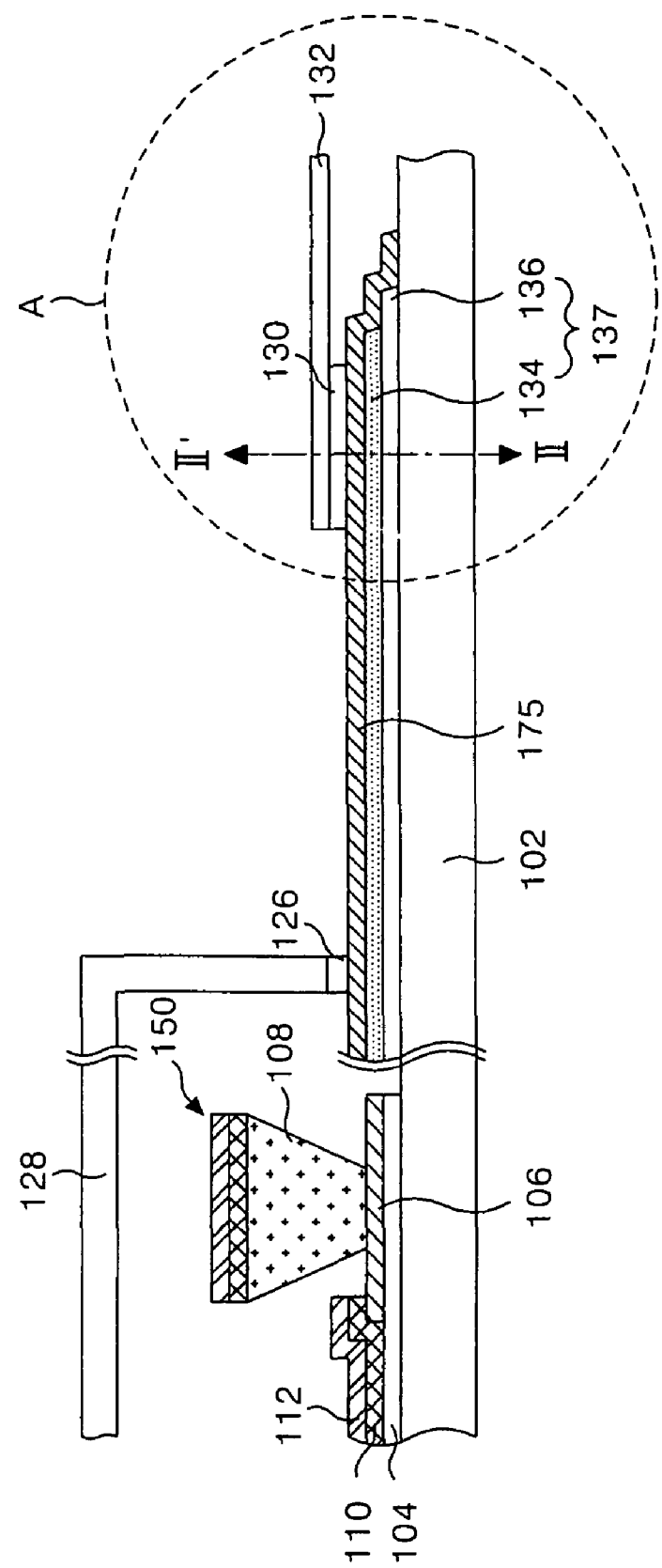
FIG. 5 is a section view showing a portion of an organic electro-luminescence display device according to a first embodiment of the present invention.
Figure 6:
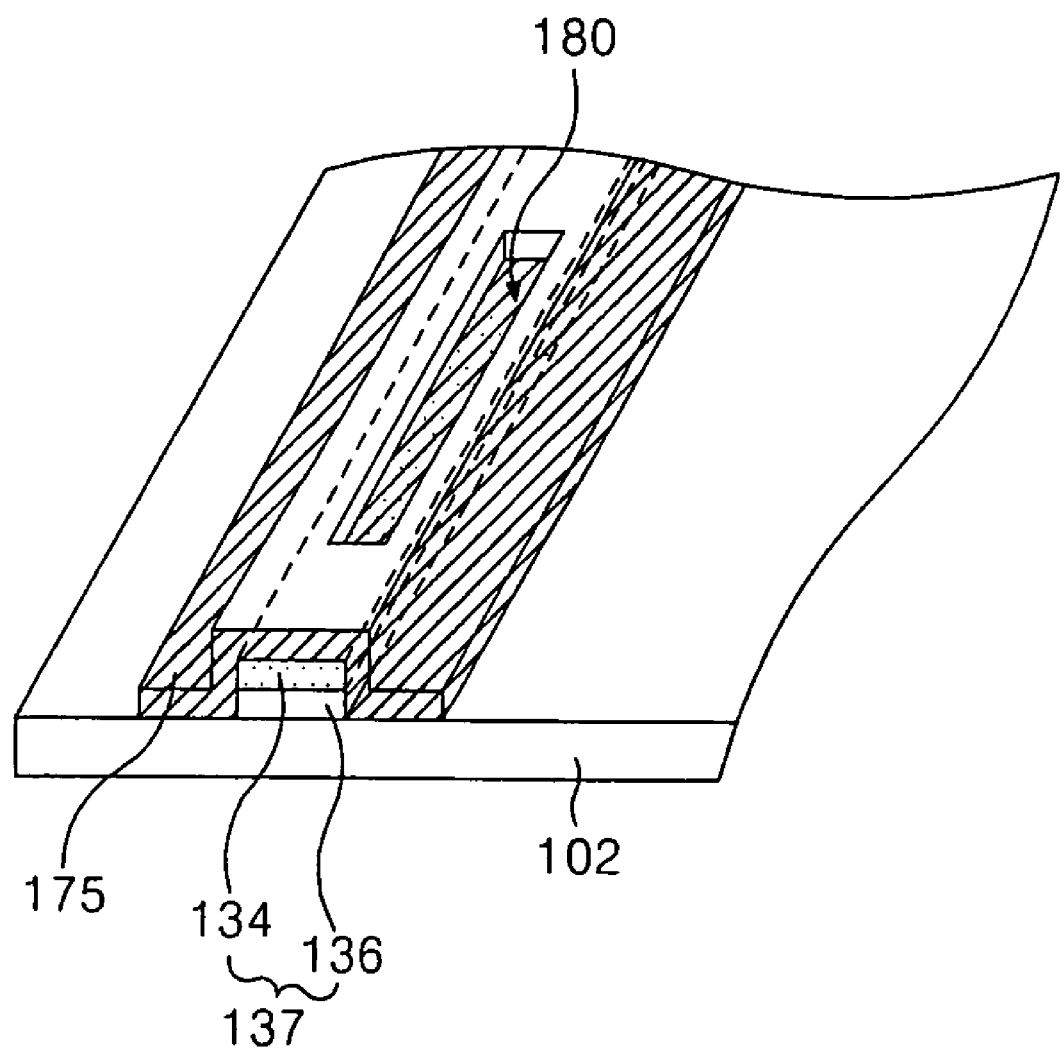
FIG. 6 is a detailed perspective view of the pad portion A shown in FIG. 5.
Figure 7:
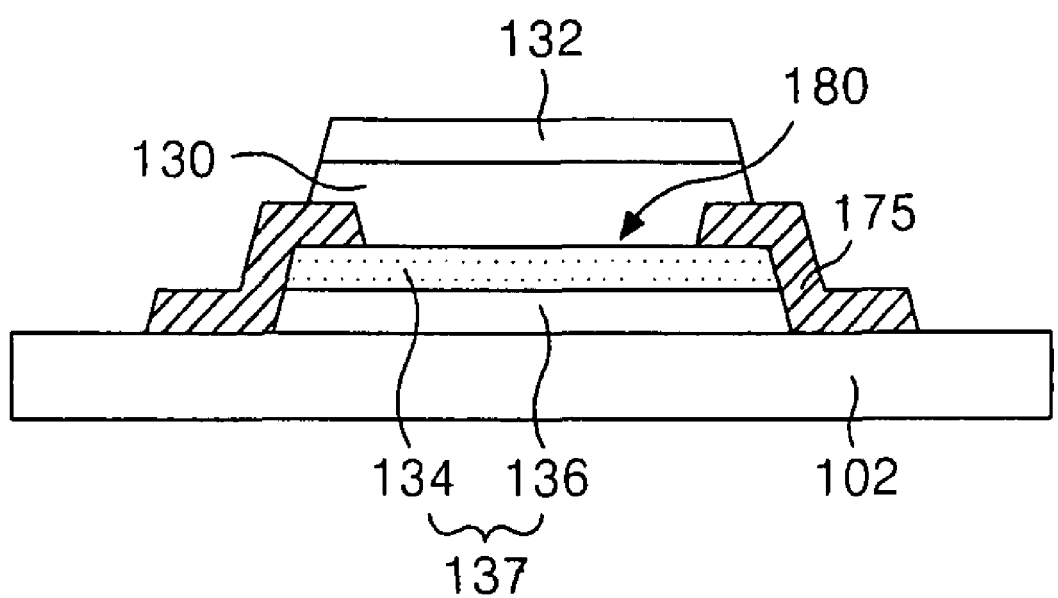
FIG. 7 is a section view of the pad portion taken along the II-V' line in FIG. 5.

FIG. 5 is a section view showing a portion of an organic electro-luminescence (EL) display device according to a first embodiment of the present invention, FIG. 6 is a detailed perspective view of the pad portion A shown in FIG. 5, and FIG. 7 is a section view of the pad portion taken along the II-II' line in FIG. 5.

Figure 1:
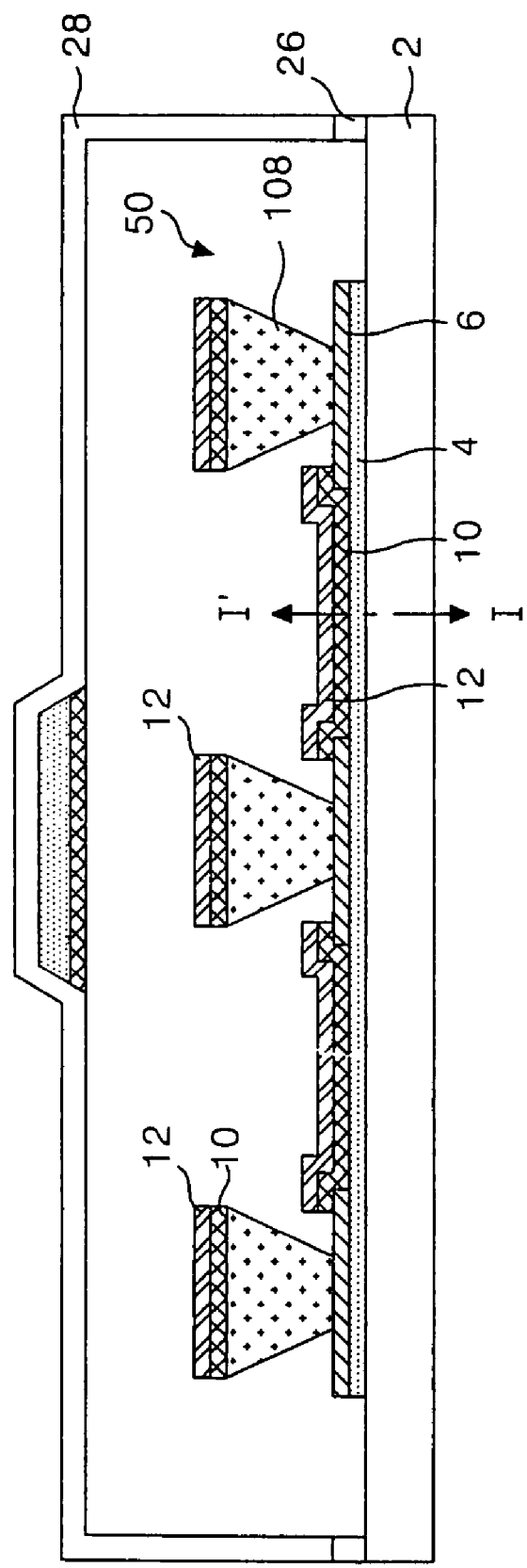
FIG. 1 is a schematic section view showing a structure of a conventional organic electro-luminescence display device.
Figure 2:
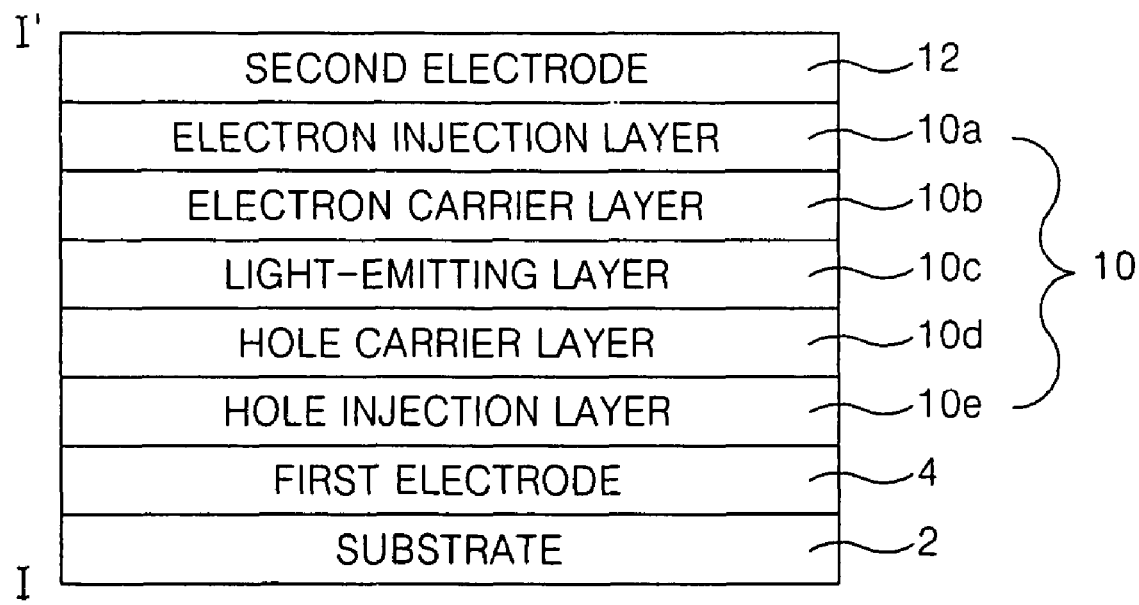
FIG. 2 is a section view of the organic electro-luminescence array taken along the Z-Z' line in FIG. 1.
Figure 3:
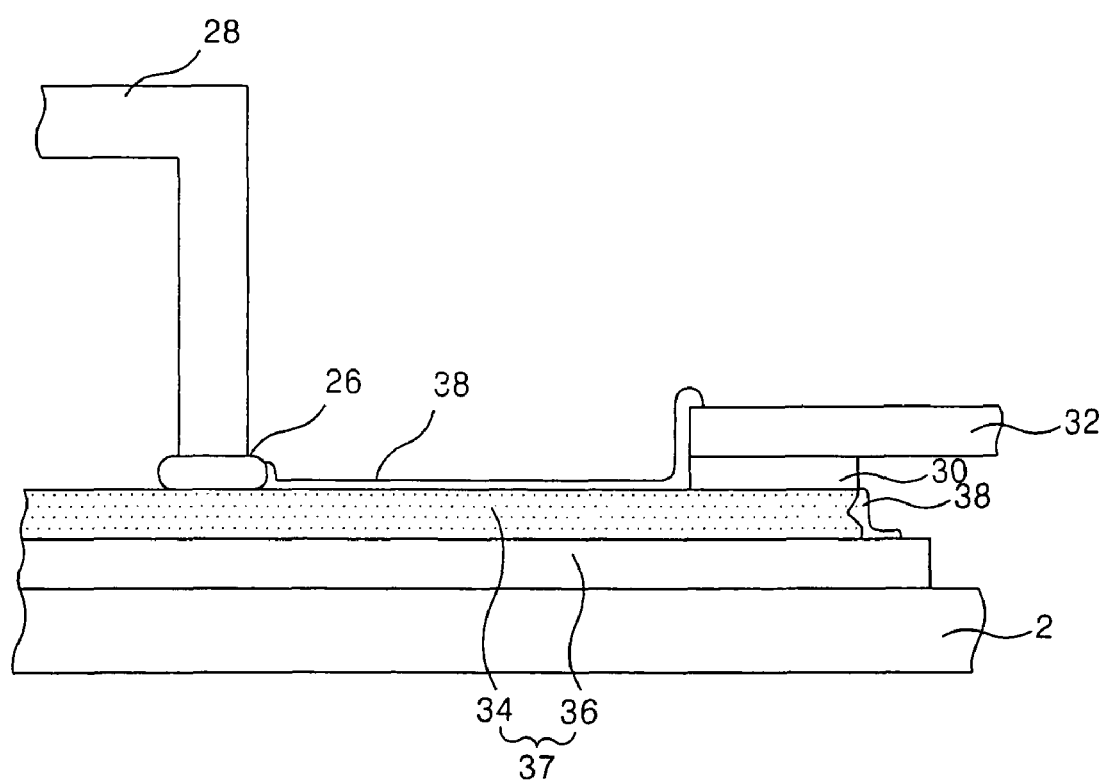
FIG. 3 is a section view showing a pad portion of the conventional electro-luminescence display device.
Figure 4:
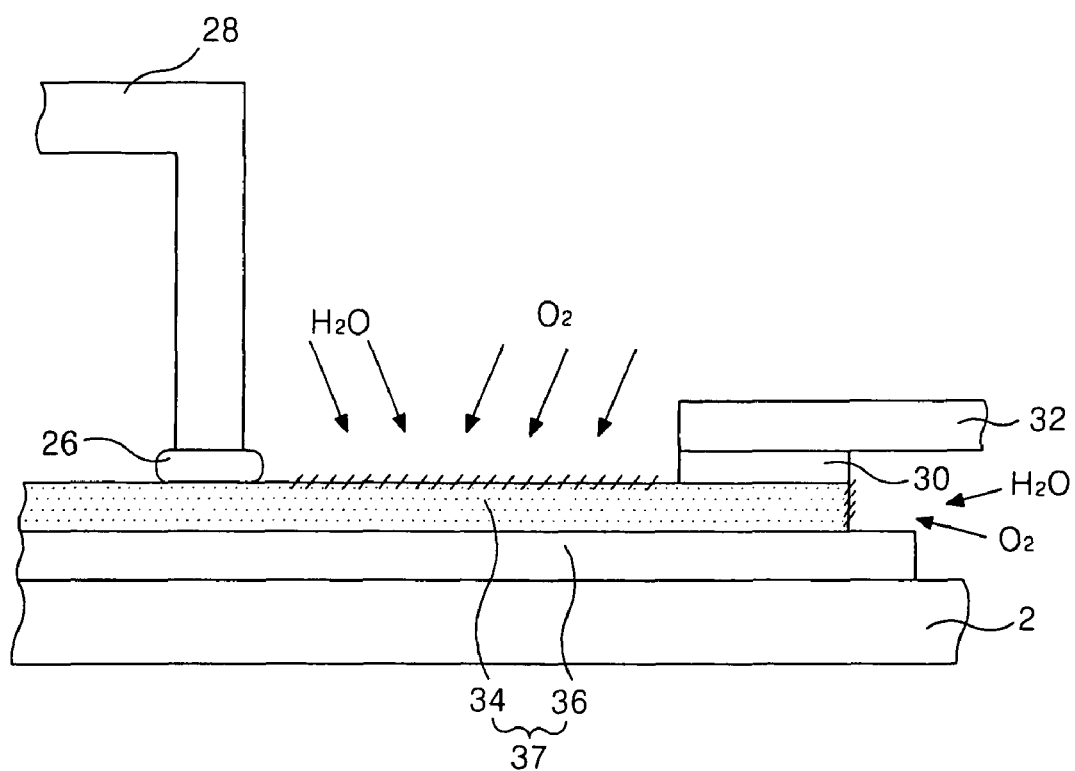
FIG. 4 depicts a badness of the conventional pad portion.

An organic EL array 150 in the organic EL display device according to the first embodiment of the present invention shown in FIG. 5 to FIG. 7 has the same structure as that in the conventional organic EL display device shown in FIG. 1 to FIG. 3.

Referring to FIG. 5 to FIG. 7, the organic EL array 150 has a first electrode (or anode electrode) 104 and a second electrode (or cathode electrode) 112 provided on a substrate 102 in a direction crossing each other.

A plurality of first electrodes 104 are formed on the substrate 2 in such a manner to be spaced at a desired distance from each other. An insulating film 106 having an aperture for each EL cell area is formed on the substrate 102 provided with the first electrode 104. On the insulating film 106, a barrier rib 108 for making a separation of an organic light-emitting layer 110 and the second electrode 112 to be formed thereon is positioned. The barrier rib 108 is provided in a direction crossing the first electrode 104, and has an overhang structure in which the upper portion thereof has a larger width than the lower portion thereof. The organic light-emitting layer 110 made from an organic compound and the second electrode 112 are entirely deposited onto the insulating film 106 provided with the barrier rib 108.

A pad 137 of the pad portion of the organic EL display device is electrically connected to a signal supplying film 132 such as a chip on film (COF) and a tape carrier package (TCP), etc. with having an anisotropic conductive film (ACF) 30 therebetween for the purpose of receiving a driving signal from the exterior thereof.

The pad 137 includes a transparent conductive layer 136 connected to the first electrode 104 or the second electrode 112, an opaque conductive layer 134 for enhancing a conductivity of the transparent conductive layer 136, and a dummy insulating pattern 175 for covering the transparent conductive layer 136 and the opaque conductive layer 134.

The dummy insulating pattern 175 plays a role to prevent oxidation or corrosion of the opaque conductive layer 134. Specifically, the dummy insulating pattern 175 is provided to cover the opaque conductive layer 134 made from molybdenum (Mo) weak to moisture ($H_2O$) and oxygen ($O_2$), etc., thereby allowing the opaque conductive layer 134 to be exposed to moisture ($H_2O$) and oxygen ($O_2$), etc.

The dummy insulating pattern 175 is provided with a contact hole 180 for exposing a portion of the opaque conductive layer 134, and the signal supplying film 132 is connected to the opaque conductive layer 134 exposed through the contact hole 180, thereby allowing it to be electrically connected to the pad 137.

Herein, indium-tin-oxide (ITO), indium-zinc-oxide (IZO), indium-tin-zinc-oxide (ITZO) or the like is used as the transparent conductive layer 136 while molybdenum (Mo), etc. is used as the opaque conductive layer 134. The dummy insulating pattern 175 is formed from the same material as the insulating pattern 106 of the organic EL array 150.

Furthermore, a silicon film 36 is provided on the dummy insulating pattern 175 or an interface area between the substrate 102 and the dummy insulating pattern 175, thereby reinforcing a protection of the opaque conductive layer 134.

As described above, the pad portion of the organic EL display device according to the first embodiment of the present invention includes the transparent conductive layer 136 and opaque conductive layer 134 electrically connected to any at least one of the first and second electrodes 104 and 112 of the organic EL array 150, and the dummy insulating pattern 175 provided to cover the transparent conductive layer 136 and the opaque conductive layer 134 and having the contact hole 180 for exposing a portion of the opaque conductive layer 134. Accordingly, it becomes possible to protect the opaque conductive layer 134 from moisture and oxygen, etc., thereby preventing a badness of the pad portion.

Figure 8:
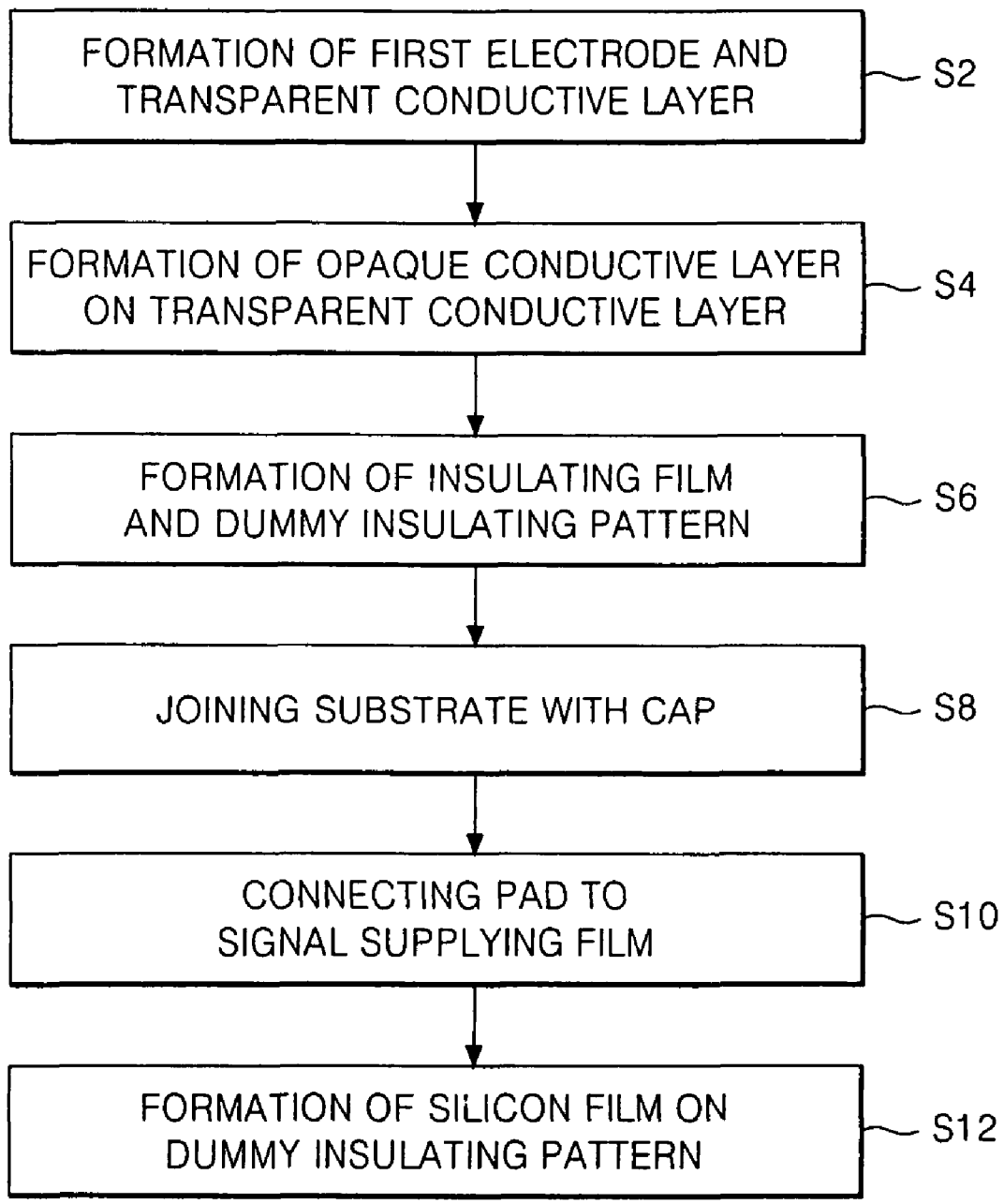
FIG. 8 is a flow chart representing a method of fabricating the organic electro-luminescence display device according to the first embodiment of the present invention.

FIG. 8 is a flow chart representing a method of fabricating the organic electro-luminescence display device according to the first embodiment of the present invention.

Firstly, at a step S2, the transparent conductive layer 136 connected to each of the first electrode 104 and the second electrode 112 of the organic EL array 150 is formed on the substrate 102. Herein, indium-tin-oxide (ITO), indium-zinc-oxide (IZO), indium-tin-zinc-oxide (ITZO) or the like is used as the transparent conductive layer 136.

At a step S4, an opaque conductive material is entirely deposited onto the transparent conductive layer 136 by a deposition technique such as the sputtering, etc. and then is patterned by the photolithography and the etching process using a mask to thereby provide the opaque conductive layer 134.

Thereafter, at a step S6, a photosensitive insulating material is deposited onto the substrate 102 provided with the first electrode, the transparent conductive layer 136 and the opaque conductive layer 134 and then is patterned by the photolithography, thereby providing the insulating film 106 of the organic EL array 150 and providing the dummy insulating pattern 175 on the opaque conductive layer 134. The insulating film 106 partially exposes the first electrode 104 to define a light-emitting area, whereas the dummy insulating film 175 is provided to cover the transparent conductive layer 136 and the opaque conductive layer 134 and has the contact hole 180 for exposing a portion of the opaque conductive layer 134.

Accordingly, there is provided the pad 136 having a structure in which the transparent conductive 136, the opaque conductive layer 134 and the dummy insulating pattern 175 are built.

Subsequently, at a step S8, the cap 128 is joined to the substrate 102 by the encapsulation process. At a step S10, the pad 137 is electrically connected, via the ACF 130, to the signal supplying film 132. In other words, the ACF 130 is connected, via the contact hole 180 of the dummy insulating pattern 175, to the opaque conductive layer 134 of the pad 137.

Finally, at a step S12, the silicon film 138 is provided on the dummy insulating pattern 175 or at an interface area between the dummy insulating pattern 175 and the substrate 102.

Figure 9:
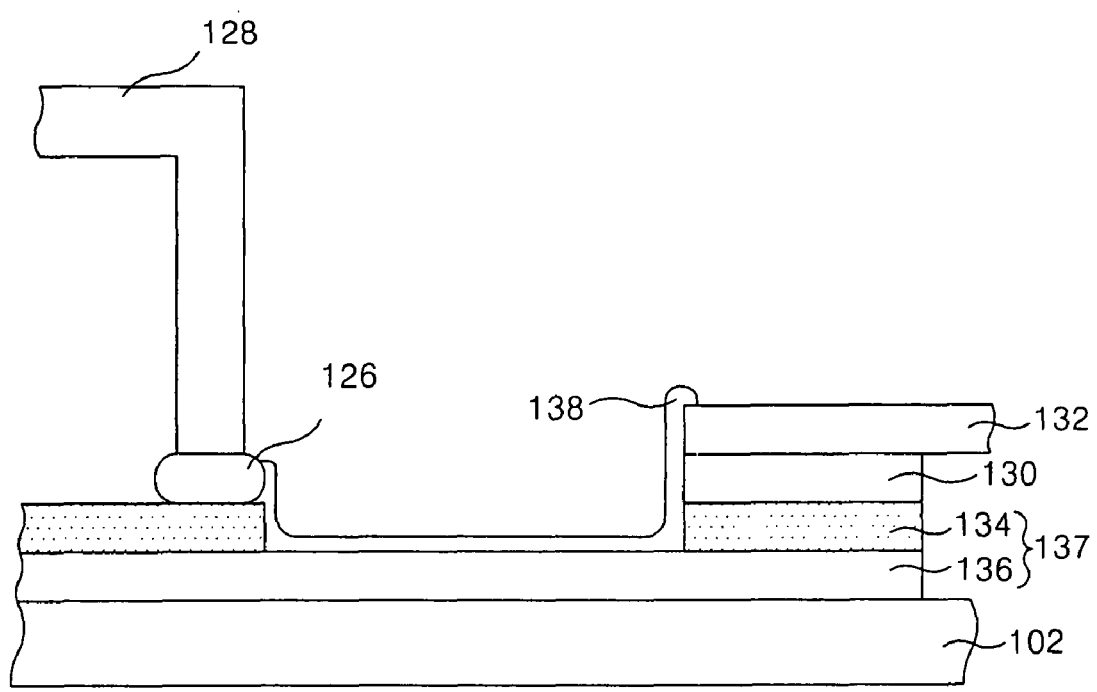
FIG. 9 is a section view showing a portion of an organic electro-luminescence display device according to a second embodiment of the present invention.

FIG. 9 is a section view showing a portion of an organic electro-luminescence (EL) display device according to a second embodiment of the present invention.

Referring to FIG. 5 to FIG. 7, the organic EL array 150 has a first electrode (or anode electrode) 104 and a second electrode (or cathode electrode) 112 provided on a substrate 102 in a direction crossing each other.

A pad 137 of the pad area of the organic EL display device is electrically connected to a signal supplying film 132, for example, connection films such as a tape carrier package (TCP), etc. with having an anisotropic conductive film (ACF) 30 therebetween for the purpose of receiving a driving signal from the exterior thereof.

The pad 137 has a structure in which a transparent conductive layer 136 connected to a first electrode 104 or a second electrode 112 of an organic EL array 150 and an opaque conductive layer 134 for enhancing a conductivity of the transparent conductive layer 136 are built. Herein, the opaque conductive layer 134 is provided on the transparent conductive layer 136 in such a manner to expose a portion of the transparent conductive layer 136. More specifically, the transparent conductive layer 136 is provided to expose the transparent conductive layer 136 at an area other than its area overlapping with a packaging plate 128 and a TCP 132. A silicon layer 134 for preventing an oxidation of the opaque conductive layer 134 caused by moisture and oxygen, etc. is provided on the opaque conductive layer 134 and the transparent conductive layer 136.

As described above, in the pad area of the organic EL display device according to the second embodiment of the present invention, the opaque conductive layer 134 is provided at an area overlapping with the packaging plate 128 and the TCP 132 on the transparent conductive layer 136 connected to any one of the first and second electrodes 104 and 112. Thus, the transparent conductive layer 136 is provided in such a manner to be exposed at an area non-overlapping with the package plate 128 and the TCP 132 of the pad area, so that it becomes possible to better prevent an oxidation of the opaque conductive layer 134 caused by moisture ($H_2O$) and oxygen ($O_2$), etc. in comparison with the prior art.

This will be described in detail below.

Generally, the opaque conductive layer 134 made from molybdenum (Mo) has an oxidation property when it is exposed to moisture and oxygen, etc., whereas the transparent conductive layer 136 made from indium-tin-oxide (ITO), indium-zinc-oxide (IZO), indium-tin-zinc-oxide (ITZO) or the like is not oxidized due to oxygen and moisture, etc. In other words, the transparent conductive layer 136 contains an oxide to have a property relatively strong to an acid in comparison with the opaque conductive layer 134.

The transparent conductive layer 136 is not oxidized even though it is exposed to moisture and oxygen in the atmosphere in the course of carrying out a joint process of the substrate 102 provided with the organic EL array 150 to the packaging plate 128 and a connection process of the pad 137 and the TCP 132 with having the ACF 130 therebetween. On the other hand, the opaque conductive layer 134 is not exposed to moisture and oxygen owing to the packaging plate 128 and the TCP 132. Thus, any conductive layer is not oxidized, so that a galvanic corrosion caused by a difference of voltages applied to each pad 37 also is not generated. Accordingly, it becomes possible to prevent a pad badness.

Figure 10:
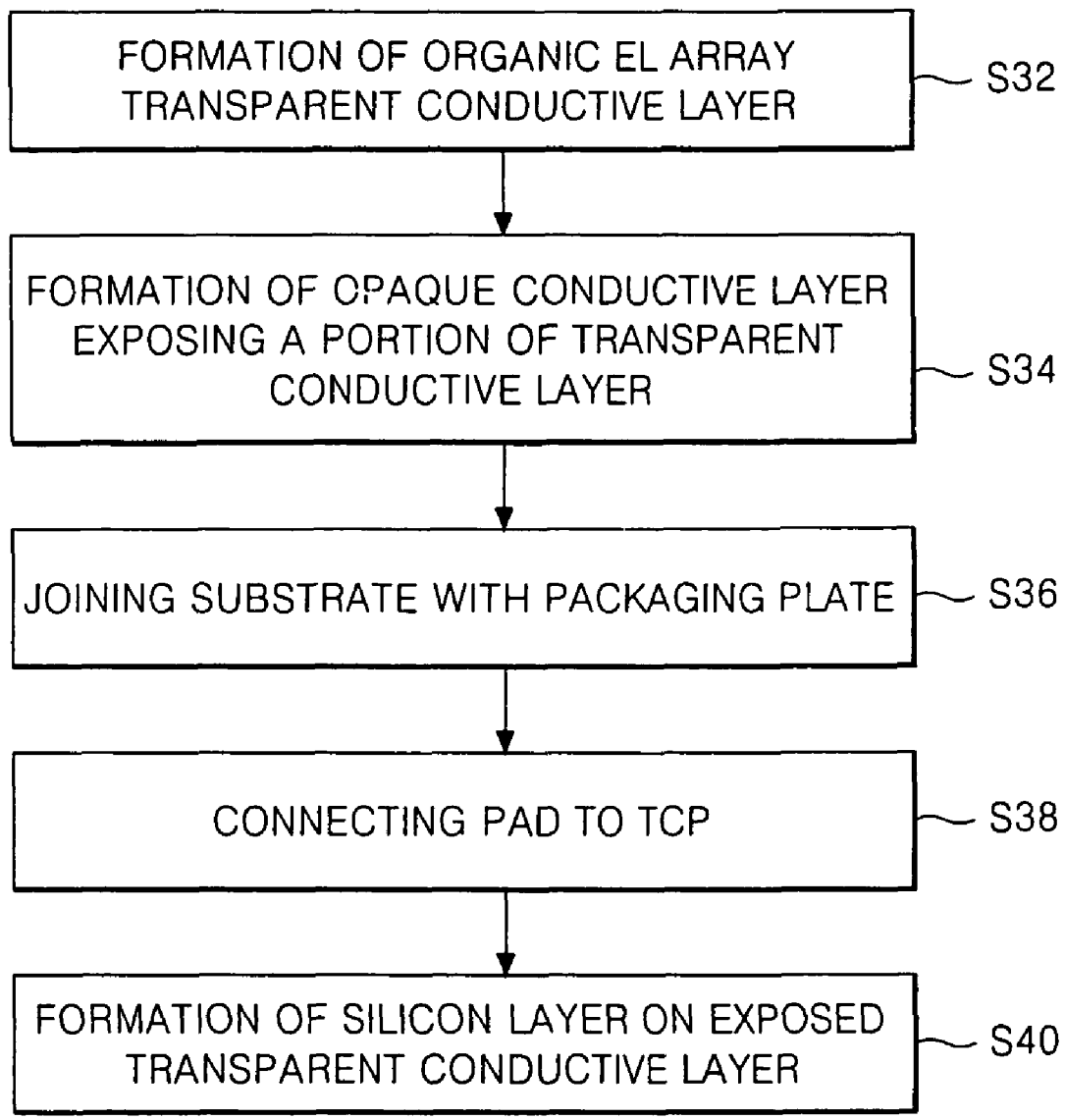
FIG. 10 is a flow chart representing a method of fabricating the organic electro-luminescence display device according to the second embodiment of the present invention.

FIG. 10 is a flow chart representing a method of fabricating the organic EL display device according to the second embodiment of the present invention.

Firstly, at a step S32, the organic EL array 150 is formed on the substrate 150 and, at the same time, the transparent conductive layer 136 connected to each of the first electrode 104 and the second electrode 112 of the organic EL array 150 is formed on the substrate 102. Herein, indium-tin-oxide (ITO), indium-zinc-oxide (IZO), indium-tin-zinc-oxide (ITZO) or the like is used as the transparent conductive layer 136.

At a step S34, an opaque conductive material is entirely deposited onto the transparent conductive layer 136 by a deposition technique such as the sputtering, etc. and then is patterned by the photolithography and the etching process using a mask to thereby provide the opaque conductive layer 134. In this case, the opaque conductive layer 134 is provided on an area to be overlapped with the packaging plate 128 to be joined with the substrate 102 and the TCP 132 electrically connected to the pad 137. Thus, the transparent conductive layer 136 at an area non-overlapping with the packaging plate 128 and the TCP 132 is exposed. Accordingly, there is provided the pad 137 having a structure in which the transparent conductive layer 136 and the opaque conductive layer 134 are built.

Subsequently, at a step 36, the packaging plate 128 is joined to the substrate 102 by an encapsulation process. At a step 38, the pad 137 is electrically connected, via the ACF 130, to the TCP 132.

Finally, at a step S40, the silicon layer 138 is formed on the exposed transparent conductive layer 136.

In the organic EL display device and the fabricating method according to the embodiments of the present invention, the opaque conductive layer 134 is provided in such a manner to expose a portion of the transparent conductive layer 136 at an area overlapping with the packaging plate 128 and the TCP 132 on the transparent conductive layer 136 for applying a driving signal to the organic EL array. Thus, the opaque conductive layer 134 is not exposed to moisture ($H_2O$) and oxygen ($O_2$), etc., thereby preventing an oxidation of the opaque conductive layer 134. Accordingly, it becomes possible to prevent a pad badness such as a generation of a galvanic corrosion caused by a difference of voltages applied to each pad 137.

As described above, according to the present invention, the pad portion includes the transparent conductive layer and the opaque conductive layer, and the dummy insulating pattern for covering the transparent conductive layer and the opaque conductive layer to protect the opaque conductive layer from moisture and oxygen, etc. Accordingly, it becomes possible to prevent a pad portion badness such as oxidation or corrosion of the opaque conductive layer.

Furthermore, according to the present invention, the opaque conductive layer is provided on the transparent conductive layer extended from the organic EL array in such a manner to expose a portion of the transparent conductive layer and overlap with the packaging plate and the TCP. Thus, the opaque conductive layer is not exposed to moisture ($H_2O$) and oxygen ($O_2$), etc., thereby preventing an oxidation of the opaque conductive layer. Accordingly, it becomes possible to prevent a pad portion badness.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro-luminescence display device, comprising:
   an organic electro-luminescence array including a first electrode, a second electrode and an organic light-emitting layer formed between the first and second electrodes;
   a pad for applying a driving signal to the organic electro-luminescence array and having a structure in which a transparent conductive layer and an opaque conductive layer exposing a portion of the transparent conductive layer are built;
   a signal supplying film electrically connected to the pad; and
   a packaging plate for enclosing the organic electro-luminescence array,
   wherein the signal supplying film is connected to the opaque conductive layer of the pad,
   the opaque conductive layer is directly in contact with a top surface of the transparent conductive layer, and
   the transparent conductive layer is exposed between an end of the packaging plate and an end of the opaque conductive layer.

2. The organic electro-luminescence display device according to claim 1, further comprising:
   a protective layer covering an entire surface of said exposed portion of the transparent conductive layer.

3. The organic electro-luminescence display device according to claim 1, wherein the transparent conductive layer contains an oxide comprising at least one of indium-tin-oxide (ITO), indium-zinc-oxide (IZO) and indium-tin-zinc-oxide (ITZO), and the opaque conductive layer contains molybdenum (Mo).

4. The organic electro-luminescence display device according to claim 1, wherein the transparent conductive layer is formed from the same material as at least one of the first electrode and the second electrode.

5. The organic electro-luminescence display device according to claim 1, further comprising a conductive film disposed between the pad and the signal supplying film.

6. The organic electro-luminescence display device according to claim 1, wherein the first electrode comprises a plurality of anode electrodes formed on a substrate, and the second electrode comprises a plurality of cathode electrodes provided in a direction crossing the plurality of anode electrodes.

7. The organic electro-luminescence display device according to claim 2, wherein the protective layer consists of silicon.

8. The organic electro-luminescence display device according to claim 2, further comprising a conductive film, wherein the protective layer is further formed on side portions of the opaque conductive layer, conductive film and the signal supplying film.

* * * * *